US008802468B2

(12) United States Patent
Hatori et al.

(10) Patent No.: US 8,802,468 B2
(45) Date of Patent: Aug. 12, 2014

(54) SEMICONDUCTOR LIGHT EMITTING DEVICE AND FABRICATION METHOD FOR SEMICONDUCTOR LIGHT EMITTING DEVICE

(71) Applicants: Fujitsu Limited, Kawasaki (JP); The University of Tokyo, Tokyo (JP)

(72) Inventors: Nobuaki Hatori, Kanagawa (JP); Tsuyoshi Yamamoto, Kawasaki (JP); Hisao Sudo, Kawasaki (JP); Yasuhiko Arakawa, Kanagawa (JP)

(73) Assignees: Fujitsu Limited, Kawasaki (JP); The University of Tokyo, Tokyo (JP)

( * ) Notice: Subject to any disclaimer, the term of this patent is extended or adjusted under 35 U.S.C. 154(b) by 0 days.

(21) Appl. No.: 13/910,153

(22) Filed: Jun. 5, 2013

(65) Prior Publication Data

US 2013/0267054 A1 Oct. 10, 2013

Related U.S. Application Data

(62) Division of application No. 12/051,449, filed on Mar. 19, 2008, now Pat. No. 8,483,252.

(30) Foreign Application Priority Data

Mar. 19, 2007 (JP) ................................ 2007-070655

(51) Int. Cl.
*H01S 5/22* (2006.01)
*H01L 33/06* (2010.01)

(52) U.S. Cl.
USPC ............... 438/31; 257/79; 372/46.01; 438/39

(58) Field of Classification Search
CPC ............ H01S 5/209; H01S 5/22; H01L 33/06
USPC ....................... 257/79; 372/46.01; 438/31, 39
See application file for complete search history.

(56) References Cited

U.S. PATENT DOCUMENTS 4,989,050 A 1/1991 Gaw et al.
5,468,975 A 11/1995 Valster (Continued)

FOREIGN PATENT DOCUMENTS

JP 61-280694 A 12/1986
JP 05-198554 A 8/1993

(Continued)

OTHER PUBLICATIONS

Japanese Office Action dated Jul. 30, 2013, issued in corresponding Japanese Patent Application No. 2007-70655 with English translation (14 pages).

(Continued)

*Primary Examiner* — Ha Tran Nguyen
*Assistant Examiner* — Raj R Gupta
(74) *Attorney, Agent, or Firm* — Westerman, Hattori, Daniels & Adrian, LLP

(57) ABSTRACT

A semiconductor light emitting device includes a lower cladding layer, an active layer, and an AlGaAs upper cladding layer mounted on a GaAs substrate. The semiconductor light emitting device has a ridge structure including the AlGaAs upper cladding layer. The semiconductor light emitting device further includes an InGaAs etching stop layer provided in contact with the lower side of the AlGaAs upper cladding layer. The InGaAs etching stop layer has a band gap greater than that of the active layer.

8 Claims, 8 Drawing Sheets

6: GaAs CONTACT LAYER
5: AlGaAs UPPER CLADDING LAYER
4: InGaAs ETCHING STOP LAYER
3: ACTIVE LAYER
2: AlGaAs LOWER CLADDING LAYER
1: GaAs SUBSTRATE

(56) References Cited

U.S. PATENT DOCUMENTS

| | | | | |
|---|---|---|---|---|
| 6,573,527 | B1 | 6/2003 | Sugiyama et al. | |
| 6,798,808 | B1 | 9/2004 | Konushi et al. | |
| 2002/0021725 | A1 | 2/2002 | Abe | |
| 2006/0186420 | A1 | 8/2006 | Hirukawa et al. | |
| 2007/0057202 | A1 | 3/2007 | Zhu et al. | |
| 2007/0230530 | A1* | 10/2007 | Kashima et al. | 372/46.01 |

FOREIGN PATENT DOCUMENTS

| | | | |
|---|---|---|---|
| JP | 5-304336 | A | 11/1993 |
| JP | 6-37405 | A | 2/1994 |
| JP | 2000-286507 | A | 10/2000 |
| JP | 2000-299531 | A | 10/2000 |
| JP | 2002-261397 | A | 9/2002 |
| JP | 2003-174232 | A | 6/2003 |
| JP | 2003-218466 | A | 7/2003 |
| JP | 3672678 | B2 | 7/2005 |
| JP | 2005-243720 | A | 9/2005 |

OTHER PUBLICATIONS

Japanese Notification of Reasons for Refusal mailed May 22, 2012, issued in corresponding Japanese Patent Application No. 2007-070655, with English translation.

Japanese Office Action dated Aug. 7, 2012, issued in corresponding Japanese Patent Application No. 2007-070655, (5 pages). With English Translation.

Japanese Office Action dated Jan. 22, 2013, issued in corresponding Japanese Patent Application No. 2007-070655. With English Translation. (9 pages).

L. M. Miller et al., "A Distributed Feedback Ridge Waveguide Quantun Well Heterostructure Laser"; IEEE Photonics Technology Letters, vol. 3, No. 1, pp. 6-8, Jan. 1991.

* cited by examiner

SEMICONDUCTOR LIGHT EMITTING DEVICE AND FABRICATION METHOD FOR SEMICONDUCTOR LIGHT EMITTING DEVICE

CROSS REFERENCE TO RELATED APPLICATIONS

This application is a Divisional of application Ser. No. 12/051,449, filed Mar. 19, 2008, which is based on and hereby claims priority to Japanese Application No. 2007-070655 filed on Mar. 19, 2007 in Japan, the entire contents of which are hereby incorporated by reference.

BACKGROUND

1) Field

This embodiment relates to a semiconductor light emitting device having a ridge structure formed on a GaAs substrate such as a semiconductor light emitting device which operates, for example, as a light source for optical fiber communications and a fabrication method for the semiconductor light emitting device.

2) Description of the Related Art

In recent years, development of lasers for optical fiber communications whose operation wavelength is within a wavelength band longer than 1 μm and in which a GaAs substrate is used such as quantum dot lasers, GaInNAs lasers and so forth is advancing.

As one of such lasers for optical fiber communications as just described, a semiconductor laser having a ridge structure including an AlGaAs cladding layer has been proposed.

In order to allow a semiconductor laser having a ridge structure including an AlGaAs cladding layer to operate in a single transverse mode, it is necessary to accurately control the width and the height of the ridge structure.

Usually, the ridge structure is formed by etching, and the width thereof can be controlled with the width of an etching mask. Further, since the height of the ridge structure depends upon the depth of etching, the height can be controlled by such a method as control of etching time or insertion of an etching stop layer.

Particularly, control of the etching depth is significant and, if the etching depth has a variation by approximately 0.1 μm from a designed value, then the cutoff waveguide width of a higher-order transverse mode of the ridge waveguide varies by approximately ±0.5 μm.

Therefore, as a high accuracy etching method for a semiconductor laser having a GaAs/AlGaAs-related ridge structure, a method is known wherein an AlGaAs layer having a high Al composition ratio (for example, the Al composition ratio is approximately 0.5) is used as a cladding layer and a GaAs layer is used as an etching stop layer, and the etching depth is controlled with an AlGaAs/GaAs interface using fluoric acid capable of selectively etching an AlGaAs cladding layer as etchant (for example, refer to Japanese Patent Laid-Open No. Hei 5-304336).

SUMMARY

One embodiment provides that a semiconductor light emitting device includes a lower cladding layer, an active layer, and an AlGaAs upper cladding layer mounted on a GaAs substrate, the semiconductor light emitting device having a ridge structure including the AlGaAs upper cladding layer, the semiconductor light emitting device further comprising an InGaAs etching stop layer provided in contact with the lower side of the AlGaAs upper cladding layer, the InGaAs etching stop layer having a band gap greater than that of the active layer.

In addition, another embodiment provides that a fabrication method for a semiconductor light emitting device includes forming a lower cladding layer on a GaAs substrate, forming an active layer on the lower cladding layer, forming an InGaAs etching stop layer having a band gap greater than that of the active layer on the active layer, forming an AlGaAs upper cladding layer on the InGaAs etching stop layer, and exposing the InGaAs etching stop layer by selectively etching the AlGaAs upper cladding layer.

DESCRIPTION OF THE PREFERRED EMBODIMENTS

In such a structure and a method as described above, if the Al composition ratio of the AlGaAs cladding layer is not set to such a high value as falls, for example, within a range from 0.45 to 0.6, then a high selection ratio cannot be achieved between the AlGaAs cladding layer and the GaAs etching stop layer when the AlGaAs cladding layer is to be selectively etched.

Further, if the Al composition ratio of the AlGaAs cladding layer is set to a high value in this manner, then the carrier mobility drops and the device resistance or the thermal resistance increases.

On the other hand, if the Al composition ratio of the AlGaAs cladding layer is set to approximately 0.4, then the device resistance and the thermal resistance can be suppressed.

Therefore, it is desirable to make it possible, in a semiconductor light emitting device having a ridge structure including an AlGaAs cladding layer and a fabrication method for the semiconductor light emitting device, to control the etching depth accurately while the device resistance and the thermal resistance are suppressed.

In the following, a semiconductor light emitting device and a fabrication method for the semiconductor light emitting device according to embodiments are described with reference to the drawings.

First Embodiment

First, a semiconductor light emitting device and a fabrication method for the semiconductor light emitting device according to a first embodiment are described with reference to FIGS. 1 to 3.

Figure 1:
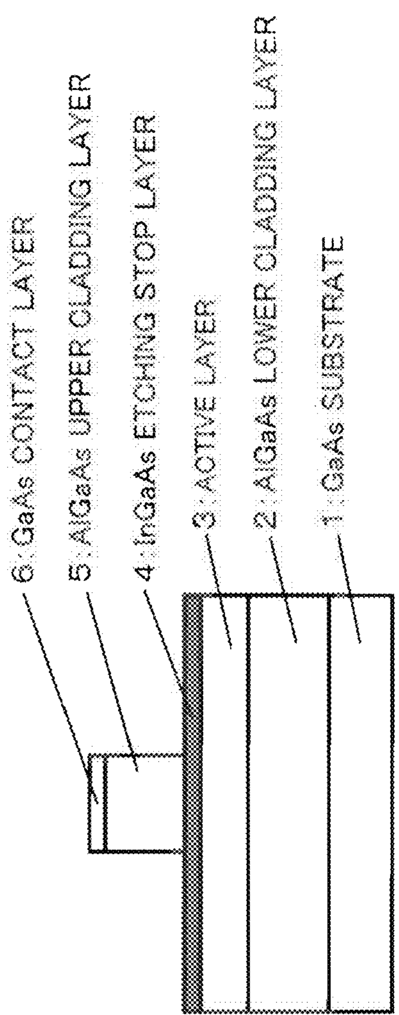
FIG. 1 is a schematic sectional view showing a configuration of a semiconductor light emitting device according to a first embodiment.

The semiconductor light emitting device according to the present embodiment is a semiconductor light emitting device such as, for example, a semiconductor laser, and includes an AlGaAs lower cladding layer 2, an active layer 3, an InGaAs etching stop layer 4, an AlGaAs upper cladding layer 5 and a GaAs contact layer 6 which are mounted on a GaAs substrate 1 as shown in FIG. 1.

In this manner, in the present structure, by inserting the InGaAs etching stop layer 4 which is less likely to be etched than GaAs by etchant (for example, etchant containing fluoric acid) for selectively etching the AlGaAs upper cladding layer 5 when an AlGaAs/GaAs-related semiconductor laser is produced, etching control at an AlGaAs/InGaAs interface can be implemented. In particular, even if the AlGaAs upper cladding layer 5 having an arbitrary Al composition ratio is used, precise control of the etching depth (ridge depth) in transverse mode control can be implemented, and a ridge bottom face can be formed on the AlGaAs/InGaAs interface just on the active layer in accordance with the design.

Consequently, since the Al composition ratio of the AlGaAs upper cladding layer 5 can be kept as low as approximately 0.4, such a situation that the drop in the carrier mobility and the rise in the device resistance and the thermal resistance can be suppressed.

Further, as shown in FIG. 1, the semiconductor light emitting device according to the present embodiment is configured as a ridge waveguide type semiconductor light emitting device which has a ridge structure including the AlGaAs upper cladding layer 5 and the GaAs contact layer 6 and has an operation wavelength of 1 μm or more.

Particularly, the InGaAs etching stop layer 4 is provided in contact with the lower side of the AlGaAs upper cladding layer 5. Further, the InGaAs etching stop layer 4 is provided in contact with the upper side of the active layer 3. The upper face of the InGaAs etching stop layer 4 is exposed on the opposite sides of the ridge structure. In short, the InGaAs etching stop layer 4 extends to the edges of the GaAs substrate 1.

Since, by providing the InGaAs etching stop layer 4 in contact with the active layer 3 in this manner, the active layer 3 and the ridge bottom face are placed near to each other in comparison with those in an alternative case wherein a different layer is provided between the InGaAs etching stop layer 4 and the active layer 3, an expanse of current can be reduced and the threshold value can be dropped.

Further, the band gap of the InGaAs etching stop layer 4 is greater than that of the active layer 3. Therefore, absorption of light by the InGaAs etching stop layer 3 does not occur.

The structure of the present semiconductor light emitting device is described in detail below with reference to FIG. 2.

Figure 2:
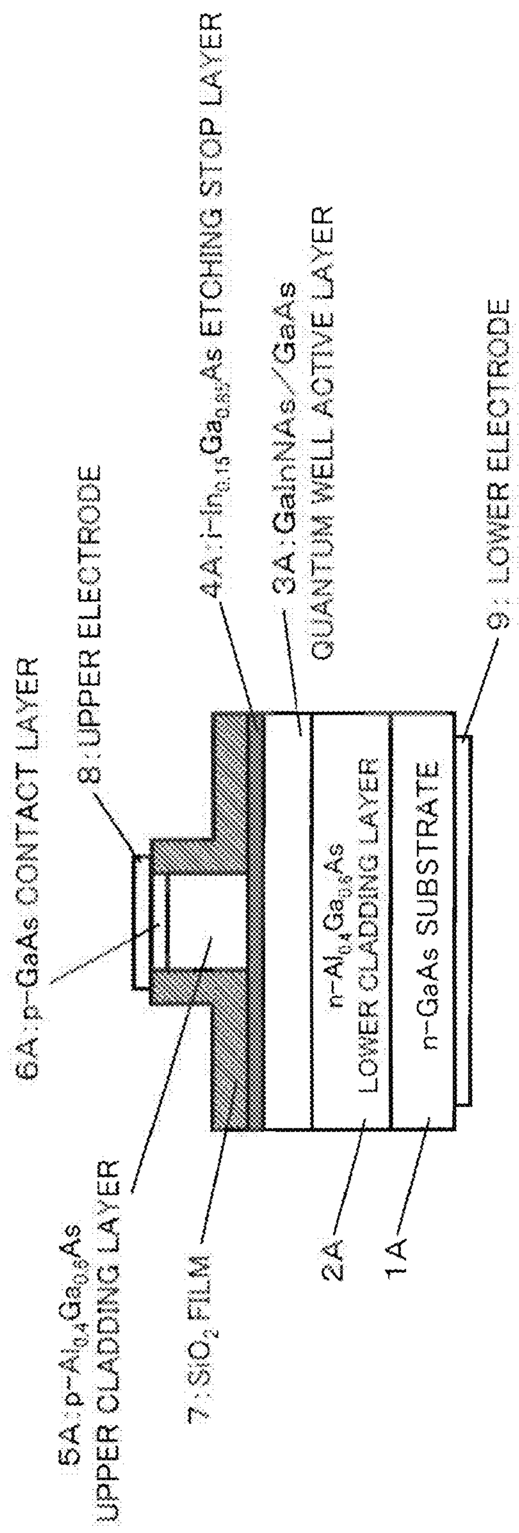
FIG. 2 is a schematic sectional view showing an example of a configuration of the semiconductor light emitting device according to the first embodiment.

As shown in FIG. 2, the present semiconductor light emitting device is configured as a ridge waveguide type semiconductor laser having such a structure that an n-$Al_{0.4}Ga_{0.6}As$ lower cladding layer 2A (for example, 1.4 μm thick), a GaInNAs/GaAs multi-quantum well active layer(s) 3A [formed by alternately stacking, for example three times, a GaInNAs quantum well layer (for example, 5 nm thick) and a GaAs barrier layer (for example, 10 nm thick)], an i-$In_{0.15}Ga_{0.85}As$ etching stop layer 4A (for example, 20 nm thick), a p-$Al_{0.4}Ga_{0.6}As$ upper cladding layer 5A (for example, 1 μm thick) and a p-GaAs contact layer 6A (for example, 0.2 μm thick) are stacked on an n-GaAs substrate (n type conductive substrate) 1A, and the stack structure is etched from the surface side so that the ridge structure (having, for example, a ridge width of 2 μm) including the p-$Al_{0.4}Ga_{0.6}As$ upper cladding layer 5A is formed and the i-$In_{0.15}Ga_{0.85}As$ etching stop layer 4A is exposed.

It is to be noted that the composition ratio of the n-$Al_{0.4}Ga_{0.6}As$ lower cladding layer 2A, p-$Al_{0.4}Ga_{0.06}As$ upper cladding layer 5A and i-$In_{0.15}Ga_{0.85}As$ etching stop layer 4A is not limited to that given above. For example, the Al composition ratio of the p-AlGaAs upper cladding layer 5A may be set lower than 0.4. Further, the In composition ratio of the i-$In_{0.15}Ga_{0.85}As$ etching stop layer 4A may be set such that the band gap becomes wider than the light emission wavelength and the film thickness becomes equal to or less than a critical thickness with which a film can grow and which depends upon the In composition ratio.

Further, while the thickness of the i-$In_{0.15}Ga_{0.85}As$ etching stop layer 4A here is set to 20 nm, the thickness is not limited to this specific value. Preferably the thickness of the i-$In_{0.15}Ga_{0.85}As$ etching stop layer 4A is set, for example, to 10 nm or more.

Further, as shown in FIG. 2, an insulating layer ($SiO_2$ film) 7 and an upper electrode (p side electrode) 8 are formed on the top face (upper surface) of the device and a lower electrode (n side electrode) 9 is formed on the bottom face (lower surface) of the device.

Further, while a resonator of the device can assume various structures depending upon the design, the resonator may be configured, for example, as a Fabry-Pérot type laser (FP type laser) which has a device length of 200 μm and uses a high reflection coating film of a high reflectance, for example, of approximately 80% applied to the opposite facets (end faces) thereof as a reflecting mirror.

In the present structure, if the ridge structure is formed using etchant containing fluoric acid, then since the etching rate of InGaAs which forms the i-$In_{0.15}Ga_{0.85}As$ etching stop layer 4A is lower than that of AlGaAs which forms the p-$Al_{0.4}Ga_{0.6}As$ upper cladding layer 5A, etching can be stopped at a stage at which the i-$In_{0.15}Ga_{0.85}As$ etching stop layer 4A is exposed. Consequently, the bottom face (lower face) of the ridge structure can be controlled accurately in accordance with the designed value.

Further, since the Al composition ratio of the p-$Al_{0.4}Ga_{0.06}As$ upper cladding layer 5A is set as low as approximately 0.4, the increase of the device resistance and the thermal resistance can be suppressed.

Furthermore, the light emission wavelength of the GaInNAs/GaAs multi-quantum well active layer 3A is 1.3 μm and the band gap wavelength of the i-$In_{0.15}Ga_{0.85}As$ etching stop layer 4A is 0.98 μm, and the band gap of the i-$In_{0.15}Ga_{0.85}As$ etching stop layer 4A is greater than that of the GaInNAs/GaAs multi-quantum well active layer 3A. Therefore, light emitted from the GaInNAs/GaAs multi-quantum well active layer 3A is not absorbed by the i-$In_{0.15}Ga_{0.85}As$ etching stop layer 4A.

Next, a fabrication method for the semiconductor light emitting device according to the present embodiment is described.

The fabrication method for the present semiconductor light emitting device includes a step of forming an AlGaAs lower cladding layer 2 on a GaAs substrate (semiconductor substrate) 1, a step of forming an active layer 3 which emits light of a wavelength of 1 μm or more on the AlGaAs lower cladding layer 2, a step of forming an InGaAs etching stop layer 4 having a band gap greater than that of the active layer 3 on the active layer 3, a step of forming an AlGaAs upper cladding layer 5 having a conduction type different from that of the AlGaAs lower cladding layer 2 on the InGaAs etching stop layer 4, and a step of selectively etching the AlGaAs upper cladding layer 5 in order to form a ridge waveguide structure so that the InGaAs etching stop layer 4 is exposed to the ridge bottom face (refer to FIG. 1).

The fabrication method for the semiconductor light emitting device is described below in more detail.

First, an n-$Al_{0.4}Ga_{0.6}As$ lower cladding layer 2A (for example, 1.4 μm thick), a GaInNAs/GaAs multi-quantum well active layer(s) 3A [formed by alternately stacking, for example three times, a GaInNAs quantum well layer (for example, 5 nm thick) and a GaAs barrier layer (for example, 10 nm thick)], i-$In_{0.15}Ga_{0.85}As$ etching stop layer 4A (for example, 20 nm thick), a p-$Al_{0.4}Ga_{0.06}As$ upper cladding layer 5A (for example, 1 μm thick) and a p-GaAs contact layer 6A (for example, 0.2 μm thick) are stacked in order on an n-GaAs substrate 1A, for example, by a molecular-beam epitaxy method (MBE method) (refer to FIG. 2).

Then, a $SiO_2$ film (for example, 300 nm thick) is deposited and a ridge waveguide pattern is formed on the $SiO_2$ film using, for example, a photolithography technique.

The $SiO_2$ film on which the ridge waveguide pattern is formed is used as a mask and the pattern is transferred to the p-GaAs contact layer 6A and the p-$Al_{0.4}Ga_{0.6}As$ upper cladding layer 5A by wet etching using, for example, etchant containing fluoric acid (that is, portions of the p-GaAs contact layer 6A and the p-$Al_{0.4}Ga_{0.6}As$ upper cladding layer 5A which are not covered with the $SiO_2$ mask are removed) so that the i-$In_{0.15}Ga_{0.85}As$ etching stop layer 4A is exposed. A ridge structure including the p-GaAs contact layer 6A and the p-$Al_{0.4}Ga_{0.6}As$ upper cladding layer 5A is formed thereby (refer to FIG. 2).

It is to be noted that the etching depth may be controlled accurately in accordance with the design, and the i-$In_{0.15}Ga_{0.85}As$ etching stop layer 4A may be etched to a desired position (in particular, part of the i-$In_{0.15}Ga_{0.85}As$ etching stop layer 4A may be etched).

Thereafter, the $SiO_2$ mask is removed and a $SiO_2$ passivation film ($SiO_2$ film) 7 is formed so as to cover the ridge structure. Then, electrodes 8 and 9 for current injection are formed at upper and lower portions of the semiconductor light emitting device, respectively (refer to FIG. 2). Further, facet coating (end face coating) is carried out after cleavage into an array form.

Accordingly, with the semiconductor light emitting device and the fabrication method for the semiconductor light emitting device according to the present embodiment, there is an advantage that, in the semiconductor light emitting device having the ridge structure including the AlGaAs upper cladding layer 5 or 5A, the etching depth can be controlled accurately while the device resistance and the thermal resistance are suppressed. Particularly, single transverse mode operation can be implemented with a semiconductor laser.

Figure 3:
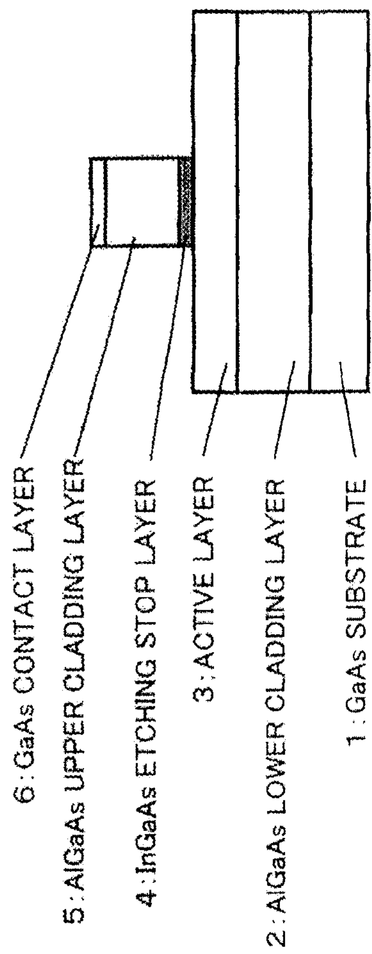
FIG. 3 is a schematic sectional view showing a configuration of a semiconductor light emitting device according to a modification to the first embodiment.

It is to be noted that, while the InGaAs etching stop layer 4 in the embodiment (refer to FIG. 1) described above is exposed on the opposite sides of the ridge structure, provision of the InGaAs etching stop layer 4 is not limited to this, and, for example, the InGaAs etching stop layer 4 may be provided only in a region just under the AlGaAs upper cladding layer 5 as shown in FIG. 3. In this instance, the upper face of the active layer 3 is exposed on the opposite sides of the ridge structure. Here, the InGaAs etching stop layer 4 is provided in contact with the lower side of the AlGaAs upper cladding layer 5 and further with the upper side of the active layer 3.

In the case of such a structure as described above, the fabrication method for the semiconductor light emitting device may include a step of removing the InGaAs etching stop layer 4 exposed by the etching. In particular, while, in the embodiment described above, the InGaAs etching stop layer 4 remains after the ridge structure is formed by etching, removal of the InGaAs etching stop layer 4 is not limited to this, but the InGaAs etching stop layer 4 may be removed completely after the ridge structure is formed by the etching (refer to FIG. 3).

In particular, the i-$In_{0.15}Ga_{0.85}As$ etching stop layer 4A may be removed by wet etching using etchant (for example, etchant in which citric acid or tartaric acid is used) for selectively etching the i-$In_{0.15}Ga_{0.85}As$ etching stop layer 4A with respect to the GaAs barrier layer which forms the uppermost face of the GaInNAs/GaAs multi-quantum well active layer 3A (refer to FIGS. 2 and 3).

Consequently, in comparison with an alternative case wherein the InGaAs etching stop layer 4 exposed by etching is left without being removed, according to the present embodiment an expanse of current in the InGaAs etching stop layer 4 can be suppressed and the threshold value can be further lower.

Further, while the undoped InGaAs etching stop layer 4A is formed in the embodiment described above, the InGaAs etching stop layer is not limited to this, but, for example, an InGaAs etching stop layer having the p type conductivity may be formed. However, since the expanse of current increases from that in an alternative case wherein the InGaAs etching stop layer is formed as the undoped InGaAs etching stop layer 4A, preferably the InGaAs etching stop layer is removed completely in order to lower the threshold value.

Further, while the etching step of forming a ridge structure in the embodiment described above is carried out using etchant containing fluoric acid, the etchant is not limited to this, but only it is necessary for the etchant to have selectivity for the InGaAs etching stop layer 4.

Further, while the etching step of forming a ridge structure in the embodiment de scribed above only includes a wet etching step using fluoric acid-related etchant, the etching step is not limited to this, but it may be divided into a plurality of steps. For example, the first-time etching step may be determined as a chlorine-related dry etching step, and the second etching step may be determined as a wet etching step using fluoric acid-related etchant. Or, the first etching step may be determined as a wet etching step using different etchant (for example, phosphoric acid-related etchant) and the second etching step may be determined as a wet etching step using fluoric acid-related etchant.

Second Embodiment

Next, a semiconductor light emitting device and a fabrication method for the semiconductor light emitting device according to a second embodiment are described with reference to FIG. 4.

Figure 4:
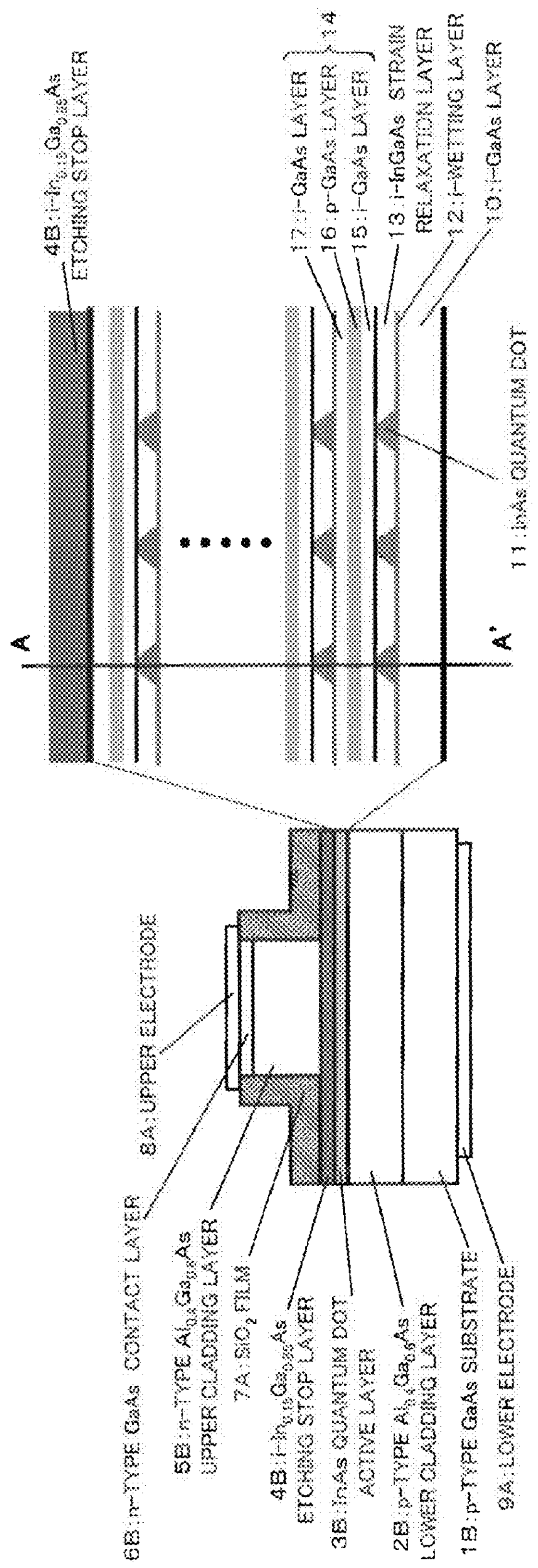
FIG. 4 is a schematic sectional view showing an example of a configuration of a semiconductor light emitting device according to a second embodiment.

The semiconductor light emitting device according to the pre sent embodiment is different from that according to the first embodiment described above in that, while the semiconductor light emitting device according to the first embodiment is structured such that the GaInNAs/GaAs multi-quantum well active layer 3A is provided on the n-GaAs substrate 1A, the semiconductor light emitting device according to the present embodiment is structured such that an InAs quantum dot active layer 3B is provided on a p-GaAs substrate 1B as shown in FIG. 4.

In particular, as shown in FIG. 4, the present semiconductor light emitting device is configured as a ridge waveguide type semiconductor laser having such a structure that a $p\text{-}Al_{0.4}Ga_{0.6}As$ lower cladding layer 2B (for example, 1.4 μm thick), an InAs quantum dot active layer 3B, an $i\text{-}In_{0.15}Ga_{0.85}As$ etching stop layer 4B (for example, 20 nm thick), an $n\text{-}Al_{0.4}Ga_{0.6}As$ upper cladding layer 5B (for example, 1 μm thick) and an n-GaAs contact layer 6B (for example, 0.2 μm thick) are stacked on the p-GaAs substrate (p type conductive substrate) 1B, and the stack structure is etched from the surface side so that the ridge structure (having, for example, a ridge width of 2 μm) including the $p\text{-}Al_{0.4}Ga_{0.6}As$ upper cladding layer 5B is formed and the $i\text{-}In_{0.15}Ga_{0.85}As$ etching stop layer 4B is exposed.

It is to be noted that the composition ratio of the $p\text{-}Al_{0.4}Ga_{0.6}As$ lower cladding layer 2B, $n\text{-}Al_{0.4}Ga_{0.6}As$ upper cladding layer 5B and $i\text{-}In_{0.15}Ga_{0.85}As$ etching stop layer 4B is not limited to this. For example, the Al composition ratio of the n-AlGaAs upper cladding layer may be lower than 0.4.

Figure 5:
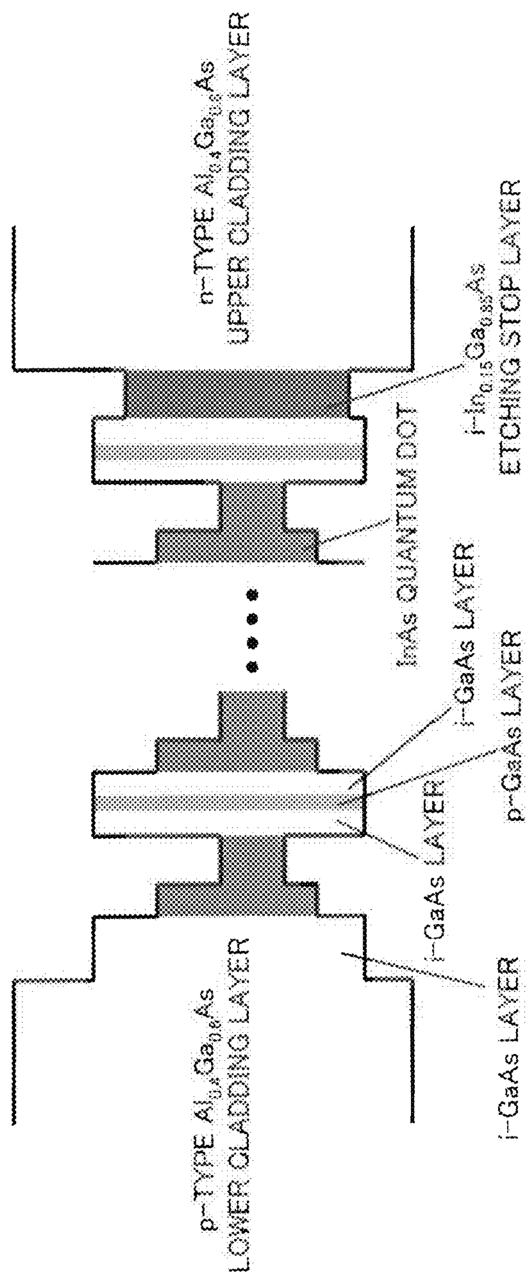
FIG. 5 is a schematic view illustrating an energy band of a quantum dot active layer of the semiconductor light emitting device according to the second embodiment and is a schematic view of the energy band on a section taken along line A-A' of FIG. 4.

Here, as shown in FIG. 4, the InAs quantum dot active layer 3B has a stack structure which includes a plurality of stacks (here, 10 stacks) each including an i-GaAs layer (barrier layer) 10 (for example, 33 nm thick), InAs quantum dots 11 whose light emission wavelength is 1.3 μm, an i-InAs wetting layer 12, an $i\text{-}In_{0.2}Ga_{0.8}As$ strain relaxation layer (side barrier layer) 13 formed so as to cover the InAs quantum dots 11, a GaAs layer (barrier layer) 14 partly doped with p type impurity [here, an i-GaAs layer 15 (for example, 14 nm thick), a p-GaAs layer 16 (for example, 10 nm thick; for example, a p type impurity concentration of $5\times10^{17}\ cm^{-3}$), and an i-GaAs layer 17 (for example, 9 nm thick)]. Further, the InAs quantum dot active layer 3B have such an energy band structure as shown in FIG. 5 (the energy band diagram on a section taken along line A-A' in FIG. 4).

It is to be noted that the configuration of the quantum dot active layer is not limited to this. For example, while the GaAs barrier layer 14 partly doped with p type impurity is used here (in particular, the GaAs barrier layer 14 includes the p-GaAs layer 16), the GaAs barrier layer 14 may otherwise be configured so as not to include the p-GaAs layer 16.

Further, as shown in FIG. 4, an insulating layer ($SiO_2$ film) 7A made of $SiO_2$ and an upper electrode (n side electrode) 8A are formed on the top face (upper surface) of the device, and a lower electrode (p side electrode) 9A is formed on the bottom face (lower surface) of the device.

Further, while a resonator of the device can assume various structures depending upon the design, the resonator may be configured, for example, as a Fabry-Pérot type laser (FP type laser) which has a device length of 200 μm and uses a high reflection coating film of a high reflectance, for example, of approximately 80% applied to the opposite facets (end faces) thereof as a reflecting mirror.

In the present structure, similarly as in the case of the first embodiment described above, if the semiconductor light emitting device is provided with the $i\text{-}In_{0.15}Ga_{0.85}As$ etching stop layer 4B and a ridge structure is formed using etchant (for example, etchant containing fluoric acid) capable of selectively etching the $n\text{-}Al_{0.4}Ga_{0.6}As$ upper cladding layer 5B with respect to the $i\text{-}In_{0.15}Ga_{0.85}As$ etching stop layer 4B, then since the etching rate of InGaAs becomes lower than that of AlGaAs, the etching can be stopped at a stage at which the $i\text{-}In_{0.15}Ga_{0.85}As$ etching stop layer 4B is exposed. Consequently, the bottom face (lower face) of the ridge structure can be controlled precisely in accordance with the design.

Further, since the Al composition ratio of the $n\text{-}Al_{0.4}As_{0.6}As$ upper cladding layer 5B is set as low as approximately 0.4, the increase of the device resistance and the thermal resistance can be suppressed.

Further, the light emission wavelength of the InAs quantum dot active layer 3B is 1.3 μm and the band gap wavelength of the $i\text{-}In_{0.15}Ga_{0.85}As$ etching stop layer 4B is 0.98 μm, and since the band gap of the $i\text{-}In_{0.15}Ga_{0.85}As$ etching stop layer 4B is greater than that of the InAs quantum dot active layer 3B, light emitted from the InAs quantum dot active layer 3B is not absorbed by the $i\text{-}In_{0.15}Ga_{0.85}As$ etching stop layer 4B as all.

The fabrication method for the semiconductor light emitting device is described in more detail below.

First, a $p\text{-}Al_{0.4}Ga_{0.6}As$ lower cladding layer 2B (for example, 1.4 μm thick), an InAs quantum dot active layer 3B, an $i\text{-}In_{0.15}Ga_{0.85}As$ etching stop layer 4B (for example, 20 nm thick), an $n\text{-}Al_{0.4}As_{0.6}As$ upper cladding layer 5B (for example, 1 μm thick) and an n-GaAs contact layer 6B (for example, 0.2 μm thick) are stacked in order on a p-GaAs (001) substrate 1B, for example, by a molecular beam epitaxy method (MBE method) (refer to FIG. 4).

Here, the InAs quantum dot active layer 3B is formed in such a manner as described below (refer to FIG. 4).

First, an i-GaAs layer (barrier layer) 10 (for example, 33 nm thick) is formed, and InAs quantum dots 11 (the light emission wavelength of the quantum dots is approximately 1.3 μm) whose surface density is approximately $4\times10^{10}\ cm^{-2}$ is formed, for example, by a self formation method and a wetting layer 12 is formed at the same time on the i-GaAs layer 10, and an $i\text{-}In_{0.2}Ga_{0.8}As$ strain relaxation layer (side barrier layer) 13 is formed so as to bury the InAs quantum dots 11 therein. It is to be noted that the InAs quantum dots 11 may be formed by a method similar to that disclosed in, for example, Japanese Patent No. 3,672,678.

Then, a GaAs layer (barrier layer) 14 partly doped with p type impurity is formed. Here, an i-GaAs layer 15 (for example, 14 nm thick), a p-GaAs layer 16 (for example, 10 nm thick; for example, a p type impurity concentration of $5\times10^{17}\ cm^{-3}$) and an i-GaAs layer 17 (for example, 9 nm thick) are stacked in order.

Thereafter, the steps of forming the InAs quantum dots 11 to the i-GaAs layer 17 are repetitively carried out by a plural number of times (here, by further 9 times). It is to be noted here that, while the number of quantum dot stacks is 10, the number of stacks is not limited to this but may be changed in accordance with a use purpose of the semiconductor light emitting device.

Then, an $i\text{-}In_{0.15}Ga_{0.85}As$ etching stop layer 4B (for example, 20 nm thick), an $n\text{-}Al_{0.4}As_{0.6}As$ upper cladding layer 5B (for example, 1 μm thick) and an n-GaAs contact layer 6B (for example, 0.2 μm thick) are stacked in order on the i-GaAs layer 17 which forms the uppermost GaAs layer 14 (refer to FIG. 4).

Then, an $SiO_2$ film (for example, 300 nm thick) is formed and a ridge waveguide pattern is formed on the $SiO_2$ film using, for example, a photolithography technique.

The $SiO_2$ film on which the ridge waveguide pattern is formed is used as a mask to carry out wet etching, for example, using etchant containing fluoric acid to transfer the pattern to the n-GaAs contact layer 6B and the $n\text{-}Al_{0.4}As_{0.6}As$ upper cladding layer 5B (that is, portions of the n-GaAs contact layer 6B and the $n\text{-}Al_{0.4}As_{0.6}As$ upper cladding layer 5B which are not covered with the $SiO_2$ mask are removed) so that the $i\text{-}In_{0.15}Ga_{0.85}As$ etching stop layer 4B is exposed. Consequently, a ridge structure including the n-GaAs contact layer 6B and the $n\text{-}Al_{0.4}As_{0.6}As$ upper cladding layer 5B is formed (refer to FIG. 4).

It is to be noted that the etching depth may be controlled accurately in accordance with the design, and the $i\text{-}In_{0.15}Ga_{0.85}As$ etching stop layer 4B may be etched to a desired position (in particular, part of the i-$In_{0.15}Ga_{0.85}As$ etching stop layer 4B may be etched).

Thereafter, the $SiO_2$ mask is removed and a $SiO_2$ passivation film ($SiO_2$ film) 7A is formed so as to cover the ridge structure (refer to FIG. 4). Then, electrodes 8A and 9A for current injection are formed on upper and lower portions of the semiconductor light emitting device, respectively (refer to FIG. 4). Further, facet (end face) coating is carried out after cleavage into an array form.

It is to be noted that, since the configuration and the fabrication method of the other part are similar to those in the first embodiment or the modification to the first embodiment described hereinabove, overlapping description thereof is omitted herein.

Accordingly, with the semiconductor light emitting device and the fabrication method for the semiconductor light emitting device according to the present embodiment, similarly as in the first embodiment described above, there is an advantage that the etching depth in the semiconductor light emitting device having the ridge structure including the AlGaAs cladding layer 5B can be controlled accurately while the device resistance and the thermal resistance are suppressed. Particularly, single transverse mode operation can be implemented in a semiconductor laser.

It is to be noted that, while the InGaAs etching stop layer in the embodiment described above is formed as the undoped InGaAs etching stop layer 4B, the InGaAs etching stop layer is not limited to this, but, for example, an InGaAs etching stop layer having an n type conductivity may be used instead. However, since the expanse of current becomes greater than that in an alternative case wherein the undoped InGaAs etching stop layer 4B is used, it is preferable to completely remove the InGaAs etching stop layer in order to lower the threshold value.

Further, similarly as in the case of the first embodiment described above, the InGaAs etching stop layer 4B may be provided only in a region just under the AlGaAs upper cladding layer 5B or different etchant may be used as the etchant for forming the ridge structure, or the etching step of forming a ridge structure may be divided into a plurality of steps.

Others

It is to be noted that, while, in the embodiments and the modification described above, the InGaAs etching stop layers 4, 4A and 4B are provided in contact with the active layers 3, 3A and 3B, respectively, provision of the InGaAs etching stop layer is not limited to this, but only it is necessary for the InGaAs etching stop layer to be provided above the active layer, and a different layer may be provided between the active layer and the InGaAs etching stop layer. In this instance, the InGaAs etching stop layer may be exposed on the opposite sides of the ridge structure, and a different layer may be exposed on the opposite sides of the ridge structure. Here, where the InGaAs etching stop layer is left without being removed, there is an effect that, while current expands, at least the ridge bottom face can be controlled precisely. On the other hand, where the InGaAs etching stop layer is removed so that a different layer is exposed, the expanse of current in the InGaAs etching stop layer can be suppressed and the threshold value can be lowered.

Figure 6:
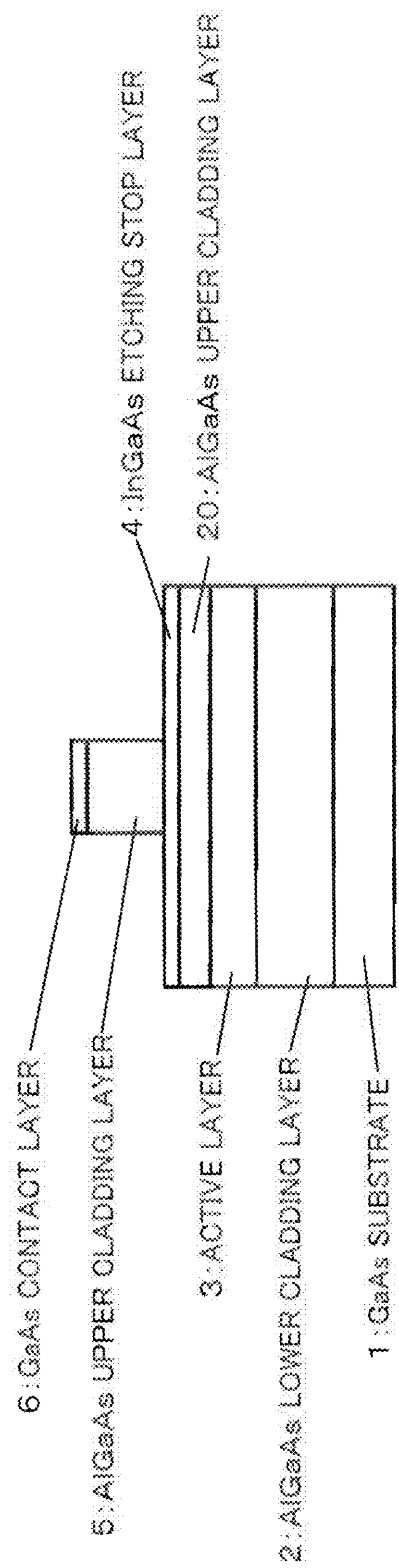
FIGS. 6 to 8 are schematic sectional views showing a configuration of semiconductor light emitting devices according to modifications to the embodiments.
Figure 7:
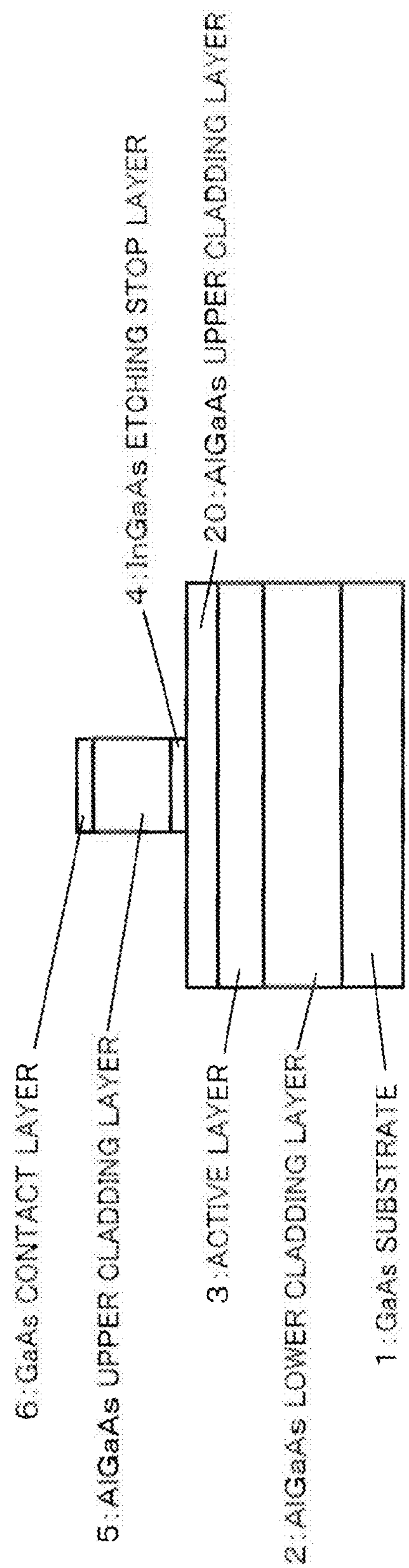

For example, the semiconductor light emitting device may be configured as a device including a different AlGaAs upper cladding layer 20 provided between the active layer 3 and the InGaAs etching stop layer 4 as shown in FIG. 6 or 7. In particular, the different AlGaAs upper cladding layer 20 may be provided in contact with the upper side of the active layer 3, and the InGaAs etching stop layer 4 may be provided in contact with the upper side of the different AlGaAs upper cladding layer 20 (that is, the different AlGaAs upper cladding layer 20 may contact with the lower side of the InGaAs etching stop layer 4).

Further, the InGaAs etching stop layer 4 may be exposed on the opposite sides of the ridge structure as shown in FIG. 6 or the different AlGaAs upper cladding layer 20 may be exposed on the opposite sides of the ridge structure as shown in FIG. 7.

Here, where the InGaAs etching stop layer 4 is left without being removed, there is an effect that, while current expands, at least the ridge bottom face can be controlled precisely. On the other hand, where the InGaAs etching stop layer 4 is removed so as to expose the different AlGaAs upper cladding layer 20, the expanse of current in the InGaAs etching stop layer 4 can be suppressed and the threshold value can be lowered.

In this instance, the fabrication method for the semiconductor light emitting device according to the embodiments and the modification described above includes a step of forming the different AlGaAs upper cladding layer 20 on the active layer 3 and forming the InGaAs etching stop layer 4 on the different AlGaAs upper cladding layer 20.

Further, while, in the embodiments and the modification described above, the semiconductor light emitting device having the quantum well active layer 3A or the quantum dot active layer 3B as the active layer 3 is described as an example, the active layer is not limited to this, but, for example, a quantum wire active layer or a bulk active layer may be used instead.

Further, while, in the embodiments and the modification described above, the semiconductor light emitting device including the active layer 3A which is formed from a GaInNAs-related compound semiconductor material and is provided on the GaAs substrate 1, 1A or 1B or the active layer 3B which is formed from an InAs-related compound semiconductor material and is provided on the GaAs substrate 1, 1A or 1B is described as an example, the semiconductor light emitting device is not limited to this.

For example, the semiconductor light emitting device can be configured also as a device having an active layer made of a different semiconductor material (for example, an active layer made of a different material-related semiconductor material from which a semiconductor laser can be formed) such as an active layer (quantum well active layer) made of an InGaAs-related compound semiconductor material which can be produced on a GaAs substrate, an active layer (quantum well active layer) made of an InGaAsSb-related compound semiconductor material further containing Sb, an active layer (quantum dot active layer) made of an InNAs-related compound semiconductor material which can be produced on a GaAs substrate, an active layer (quantum dot active layer) made of an InAsSb-related compound semiconductor material or an active layer (quantum dot active layer) made of an InNAsSb-related compound semiconductor material. Also the material for forming the contact layer or the lower cladding layer is not limited to those in the embodiments and the modification described above.

Further, while, in the embodiments and the modification described above, the semiconductor light emitting device formed on the n-type conductive substrate 1A or the p-type conductive substrate 1B is described as an example, the semiconductor light emitting device is not limited to this, but may otherwise be configured as a device which is formed, for example, on a high-resistance substrate. The semiconductor light emitting device can be configured, for example, also as a transverse current injection type semiconductor light emitting device (transverse current injection type semiconductor laser) formed on a high-resistance substrate.

Figure 8:
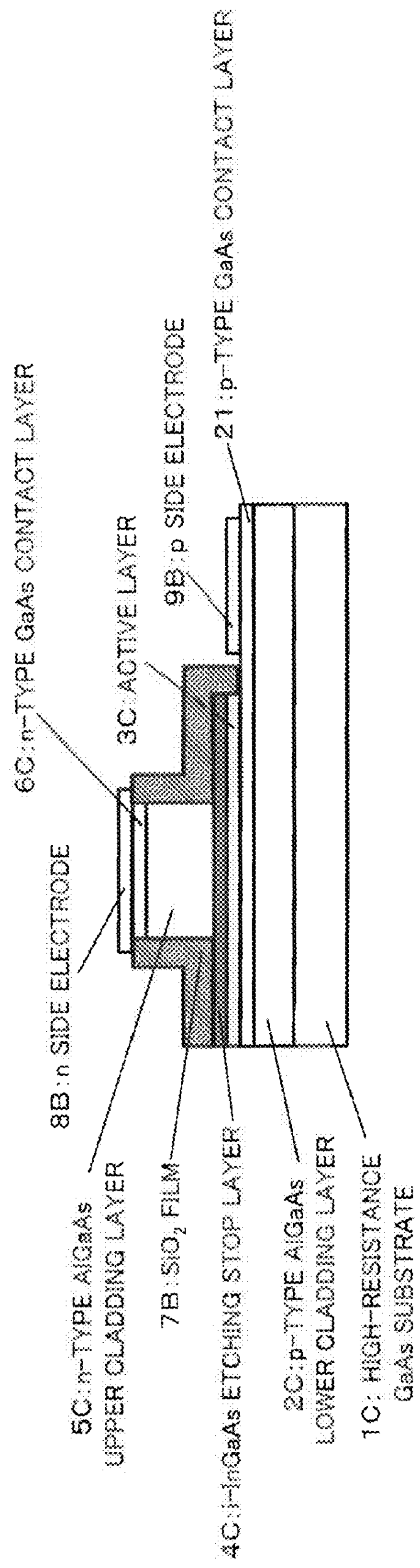

Here, for example, as shown in FIG. 8, the transverse current injection type semiconductor light emitting device has such a structure that a p-AlGaAs lower cladding layer 2C, a p-GaAs contact layer 21, an active layer 3C, an i-InGaAs etching stop layer 4C, an n-AlGaAs upper cladding layer 5C and an n-GaAs contact layer 6C are stacked in order on a high-resistance GaAs substrate 1C and has a ridge structure including the n-AlGaAs upper cladding layer 5C, and an insulating layer ($SiO_2$ film) 7B made of $SiO_2$, an n-side electrode 8B and a p-side electrode 9B are formed on the top face of the device. In particular, in comparison with the configuration (refer to FIG. 4) of the particular example of the second embodiment described above, the transverse current injection type semiconductor light emitting device is configured as a device wherein the high-resistance GaAs substrate 1C is used and the high-resistance GaAs substrate 1C and the p-AlGaAs lower cladding layer 2C are extended, and the p-GaAs contact layer 21 is provided between the p-AlGaAs lower cladding layer 2C and the active layer 3C while the p-side electrode 9B is provided on the p-GaAs contact layer 21.

Further, while, in the embodiments and the modification described above, the semiconductor light emitting device is described taking a case wherein it is configured as a Fabry-Pérot type laser as an example, the semiconductor light emitting device is not limited to this. For example, the semiconductor light emitting device can be configured also as a distribution feedback type laser [DFB (Distributed Feed-Back) laser] or a distribution reflection type laser [DBR (Distributed Bragg Reflector) laser] having a diffraction grating, such as a distribution feedback type laser (for example, refer to IEEE Photonics Technology Letters, Vol. 3, No. 1, pp. 6-8) wherein a diffraction grating is formed vertically from the surface side sidewardly of a waveguide.

Further, while, in the embodiments and the modification described above, the semiconductor light emitting device is de scribed taking a semiconductor laser the 1.3 μm wavelength band as an example, the semiconductor light emitting device is not limited to this, but the present invention can be applied widely to semiconductor lasers (semiconductor light emitting devices) wherein the operation wavelength is within a wavelength band longer than 1 μm such as the 1.2 μm wavelength band semiconductor laser used for a short-range LAN and the 1.06 μm wavelength band semiconductor laser for YAG laser excitation.

Further, while, in the embodiments and the modification described above, the semiconductor light emitting device is described taking the ridge waveguide type semiconductor light emitting device produced by one-time crystal growth and etching as an example, the semiconductor light emitting device is not limited to this, but the present invention can be applied also to semiconductor light emitting devices (buried-heterostructure type semiconductor light emitting devices) produced by plural-time crystal growth including buried growth.

Further, the present invention is not limited to the embodiments specifically described above, and variations and modifications can be made without departing from the scope of the present invention.

What is claimed is:

1. A fabrication method for a semiconductor light emitting device, comprising:

forming a lower cladding layer over a GaAs substrate;

forming an active layer over the lower cladding layer;

forming an InGaAs etching stop layer on a GaAs layer or an AlGaAs layer, the InGaAs etching stop layer having a band gap greater than that of the active layer over the active layer;

forming an AlGaAs upper cladding layer on the InGaAs etching stop layer;

exposing the InGaAs etching stop layer by selectively etching the AlGaAs upper cladding layer; and removing the InGaAs etching stop layer exposed by the etching, wherein a ridge structure formed in the exposing and the removing includes the AlGaAs upper cladding layer and the InGaAs etching stop layer, and the upper side of the GaAs layer or the AlGaAs layer is exposed on opposite sides of the ridge structure.

2. The fabrication method for a semiconductor light emitting device as claimed in claim 1, wherein, when forming the InGaAs etching stop layer, forming a different AlGaAs upper cladding layer as the GaAs layer or the AlGaAs layer over the active layer and forming the InGaAs etching stop layer on the different AlGaAs upper cladding layer.

3. The fabrication method for a semiconductor light emitting device as claimed in claim 1, further comprising, after forming the AlGaAs upper cladding layer, forming a contact layer on the AlGaAs upper cladding layer; and forming an electrode being only in contact with the contact layer located at a top portion of a ridge structure formed in the exposing.

4. The fabrication method for a semiconductor light emitting device as claimed in claim 1, wherein a top face of a ridge structure formed in the exposing is perpendicular to a side face of the ridge structure.

5. The fabrication method for a semiconductor light emitting device as claimed in claim 1, wherein, in the forming the InGaAs etching stop layer, forming the InGaAs etching stop layer on an uppermost GaAs layer included in the active layer as the GaAs layer or the AlGaAs layer.

6. The fabrication method for a semiconductor light emitting device as claimed in claim 1, wherein the Al composition ratio of the AlGaAs upper cladding layer is 0.4 or less.

7. The fabrication method for a semiconductor light emitting device as claimed in claim 1, wherein the active layer is a quantum dot active layer.

8. The fabrication method for a semiconductor light emitting device as claimed in claim 1, wherein a ridge structure formed in the exposing is formed by a first etching process and a second etching process different from the first etching process.

* * * * *